United States Patent [19]
Hodges

[11] Patent Number: 5,831,897
[45] Date of Patent: Nov. 3, 1998

[54] SRAM MEMORY CELL DESIGN HAVING COMPLEMENTARY DUAL PASS GATES

[75] Inventor: Robert Louis Hodges, Phoenix, Ariz.

[73] Assignee: STMicroelectronics, Inc., Carrollton, Tex.

[21] Appl. No.: 766,404

[22] Filed: Dec. 12, 1996

[51] Int. Cl.[6] .................................................. G11C 11/412
[52] U.S. Cl. ..................... 365/156; 365/154; 365/190; 365/181; 365/161; 257/903; 257/904; 257/67; 257/350
[58] Field of Search ...................................... 365/156, 154, 365/190, 181, 161; 257/903, 904, 393, 67, 350

[56] References Cited

U.S. PATENT DOCUMENTS

| | | | |
|---|---|---|---|
| 5,040,146 | 8/1991 | Mattausch et al. | 365/154 |
| 5,347,487 | 9/1994 | Dao et al. | 365/189.05 |
| 5,353,251 | 10/1994 | Uratani et al. | 365/189.05 |
| 5,623,440 | 4/1997 | Saito | 365/149 |

*Primary Examiner*—David C. Nelms
*Assistant Examiner*—Andrew Q. Tran
*Attorney, Agent, or Firm*—Theodore E. Galanthay; Kenneth C. Hill; Lisa K. Jorgenson

[57] ABSTRACT

A memory cell in which data is written and read from a pass gate. The memory cell has a connection to a first pass gate, connecting the memory cell to a bit line. Additionally, the memory cell has a second pass gate connecting the memory cell to a complementary bit line. The pass gates are controlled by a word line and a complementary word line.

14 Claims, 2 Drawing Sheets

SRAM MEMORY CELL DESIGN HAVING COMPLEMENTARY DUAL PASS GATES

BACKGROUND OF THE INVENTION

1. Technical Field

The present invention relates to integrated circuits, and more specifically to semiconductor memory devices.

2. Description of the Related Art

The most basic part of a semiconductor memory is the data storage cell, also called a "memory cell", which can be anything that can store two well defined states in a specified and repeatedly accessible location. In semiconductor memories, the most common storage device elements are either a latch or a capacitor. When a memory bit is stored in a latch, or a bi-stable flip-flop, the memory cell is said to be a static memory cell because it does not require its data to be refreshed as long as power is applied to the memory cell. Latched semiconductor memory cells are bi-stable transistor flip-flops in various configurations. Semiconductor flip-flops can be made of either metal-oxide-semiconductor (MOS) or bipolar transistors. Presently, with both a static random access memory (SRAM) or a dynamic random access memory (DRAM), an n-channel field effect device is often used to write a good "0", but a not a good "1". A good "1" or a good "0" is a logic state at the upper power supply voltage or the lower power supply voltage, respectively. Instead of a "1" being defined at the upper power supply voltage (e.g., VCC), the "1" is defined by subtracting the threshold voltage (VT) of the n-channel field effect device from VCC (rather than by VCC).

This setting of a "1" can affect cell stability when the power supply voltage is scaled because it is not desirable to scale VT in the n-channel field effect device due to subthreshold leakage problems. Therefore, it would be advantageous to have an improved method and apparatus for writing a good "1" into a memory cell.

SUMMARY OF THE INVENTION

The present invention provides a memory cell in which data is written and read through a pass gate. The memory cell has a connection to a first pass gate, connecting the memory cell to a bit line. Additionally, the memory cell has a second pass gate connecting the memory cell to a complementary bit line. The pass gates are controlled by a word line and a complementary word line.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
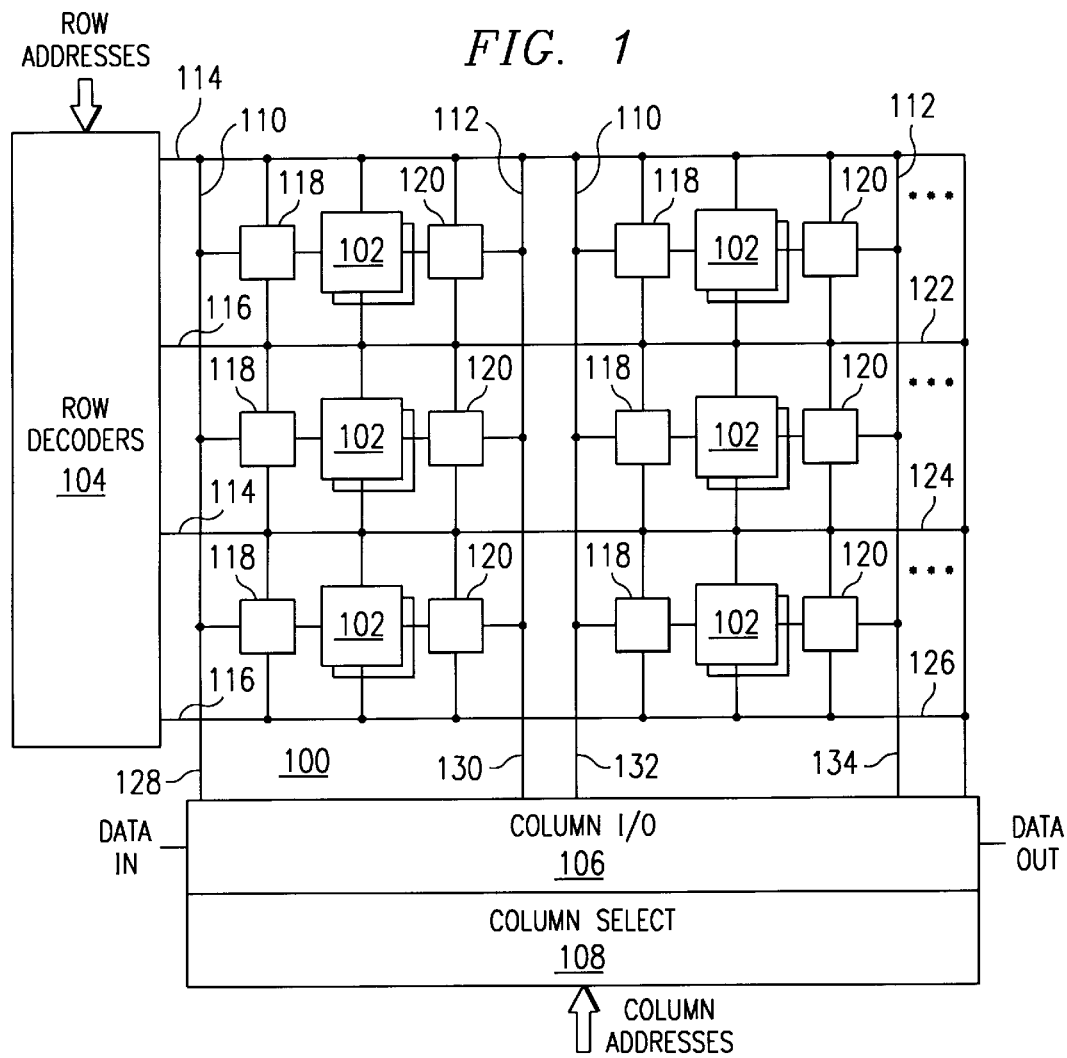
FIG. 1 is a block diagram of a memory device is depicted according to the present invention.

According to the present invention, a complementary metal oxide semiconductor (CMOS) pass gate (hereinafter referred to as "pass gate") is employed to write both a "0" or a "1" into a memory cell. The pass gate allows for both a good "0" and a good "1" to be written into a memory cell. In other words, the "0" is defined by the lower power supply voltage and the "1" is defined by the upper power supply voltage. With reference now to FIG. 1, a block diagram of a memory 100 is depicted according to the present invention. Memory 100 includes memory cells 102, row decoders 104, column input/output (I/O) 106, and column select 108. Memory cells 102 are arranged in a matrix of rows and columns and are connected to bit lines 110 and bit lines 112 and word lines 114 and word lines 116 by pass gates 118 and pass gates 120. Bit lines 110 and bit lines 112 form a bit line pair. Similarly, word lines 118 and word lines 120 form word line pairs. Bit lines 112 are complementary bit lines to bit lines 110; word lines 120 are complementary word lines to word lines 118. Column select 108 receives signals labelled column addresses while row decoders receive address signals labelled row addresses. These signals are used to select cells within memory 100 for reading or writing according to the present invention. Memory cells 102 located within memory 100 may be a variety of memory cells, such as, for example, SRAM memory cells or DRAM memory cells according to the present invention. Pass gates 118 and pass gates 120 provide a mechanism for writing both a good "0" and a good "1" into memory cells 102 within memory 100. Although memory 100 is depicted with six memory cells, other numbers of memory cells may be used according to the present invention.

Figure 2:
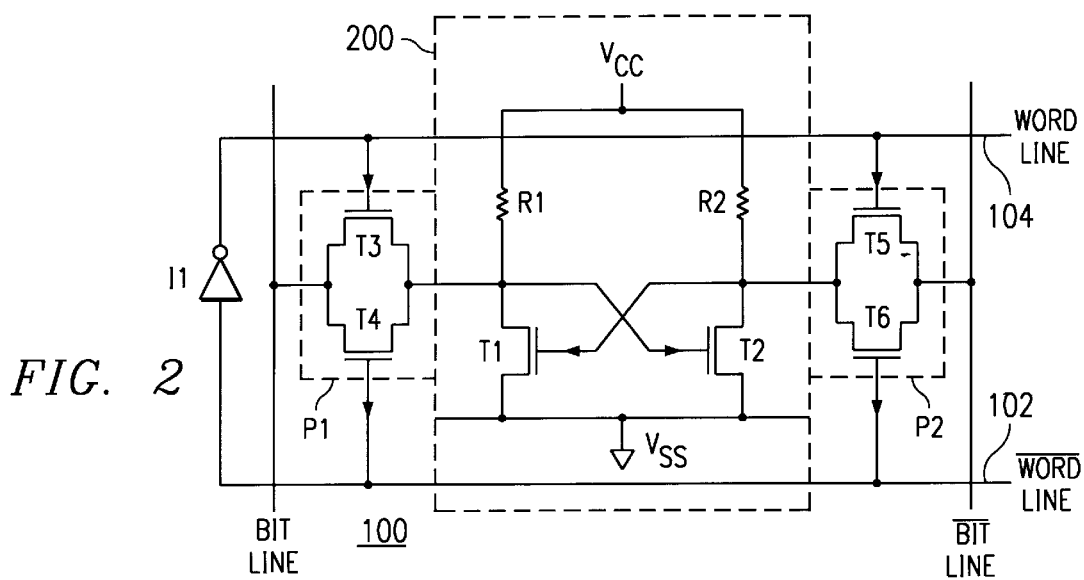
FIG. 2 is a schematic diagram of a memory cell is depicted according to the present invention.

With reference now to FIG. 2, a schematic diagram of a memory cell is depicted according to the present invention. Memory cell 200 may be implemented as a memory cell 102 within the memory 100 in FIG. 1. Memory cell 200 is an SRAM memory cell which includes storage transistors T1 and T2 and resistors R1 and R2. In the depicted example, storage transistors T1 and T2 are n-channel transistors having their drains connected to resistors R1 and R2 respectively. Memory cell 200 has a connection to an upper power supply voltage (e.g., VCC) through resistors R1 and R2. In addition to providing a connection to upper power supply voltage VCC, resistors R1 and R2 form the load elements of SRAM cell 200. The sources of storage transistors T1 and T2 are connected to a lower power supply voltage (e.g., VSS). Storage transistor T1 has its gate connected to the drain of storage transistor T2, and storage transistor T2 has its gate connected to the drain of storage transistor T1.

Access to SRAM cell 200 is provided by pass gates P1 and P2. Pass gates P1 and P2 include transistors T3–T6 with transistors T3 and T5 being n-channel transistors, while transistors T4 and T6 are p-channel transistors according to a preferred embodiment of the present invention. The transistors in a pass gate are connected in parallel with each other. Pass gates P1 and P2 allow for a good "0" and a good "1" to be written into memory cell 200. Because the effect of a threshold voltage from storage transistor T1 or storage transistor T2 being involved is avoided by the use of pass gate P1 and pass gate P2. According to a preferred embodiment of the present invention, the p-channel transistors are implemented using a PMOS thin film transistor "TFT". Invertor I1 is used to invert the complementary word line signal in complementary word line 102 to generate a word line signal in word line 104 to drive pass gates P1 and P2 according to the present invention.

Figure 3:
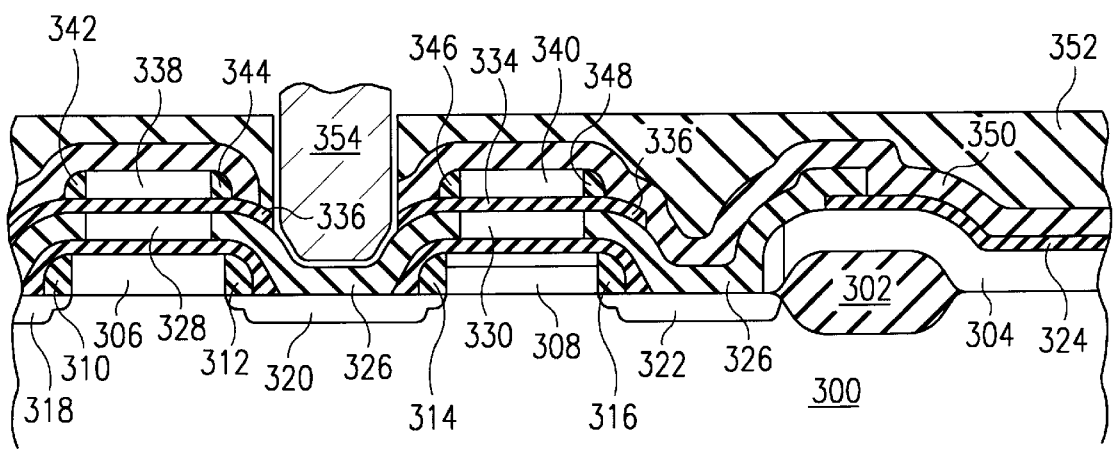
FIG. 3 is a cross-sectional view of p-channel transistors and n-channel transistors in pass gates depicted according to the present invention.

Turning now to FIG. 3, a cross-sectional view of p-channel transistors and n-channel transistors in pass gates are depicted according to the present invention. Substrate 300 has a field oxide 302 extending into and above substrate 300. Polysilicon layer 304 is a poly1 layer in the depicted example. Polysilicon layer 304 is separated from substrate 300 by a gate oxide (not shown). Portions of polysilicon layer 304 are removed to form gates 306 and 308. Additionally, sidewalls 310, 312, 314, and 316 are formed as can be seen in FIG. 3. Gates 306 and 308 are gates for n-channel transistors in a pass gate such as transistor T3 or T5 in FIG. 2. Source/drain regions 318, 320, and 322 are formed over the structures with portions removed as illustrated in FIG. 3.

Polysilicon layer 326, a poly2 layer, is formed with portions of polysilicon layer 326 being doped to form channels 328 and 330 to form p-channel transistors in the form of thin film transistors in the depicted example. Thereafter, oxide layer 336 is formed and etched to form gate oxide layers for the thin film transistors. Next, a polysilicon layer is formed over the structures and etched to form gates 338 and 340. Additionally, sidewalls 342, 344, 346, and 348 are formed as illustrated in FIG. 3. Next, a deep oxide layer 350 is formed over the structures with a planarizing layer 352 being formed over oxide layer 350. The planarizing layer may be made of various materials, such as BPSG or PSG according to the present invention. A bit line 354 is formed. In the depicted example, bit line 354 may be formed using aluminum. The doped portions of polysilicon layer 322 may be doped to form titanium silicide (TiSi$_2$). Gates 306 and 308 are connected to a word line, such as word line 104 while gates 338 and 340 are connected to complementary word line, such as complementary word line 102.

Figure 4:
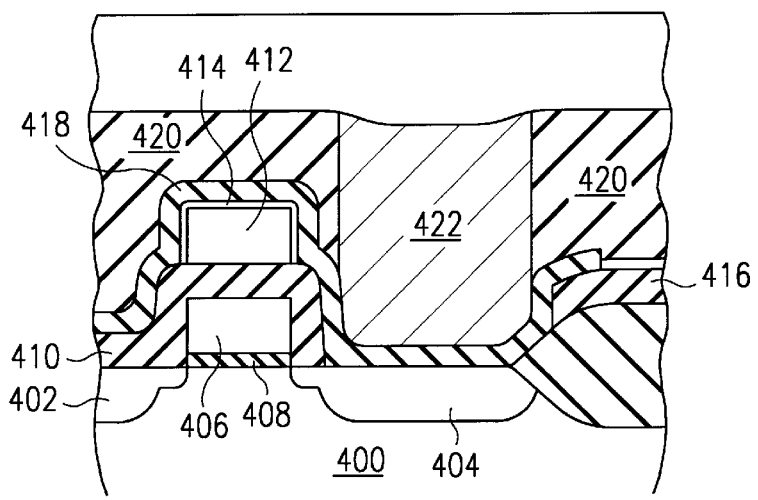
FIG. 4 is a cross sectional view of a pass gate with an inverted TFT depicted according to the present invention.

With reference now to FIG. 4, a cross sectional view of a pass gate with an inverted TFT is depicted according to the present invention. In the depicted example, the TFT has the gate on the bottom and the channel on the top. As can be seen, substrate 400 include source drain regions 402 and 404. A polysilicon gate 406 is formed over a gate oxide 408. An oxide layer 410 is then formed over polysilicon gate 406. This oxide layer also could be a silicon nitride layer. Thereafter, a polysilicon gate 412 is formed over oxide layer 410 and oxide layer 414 is formed over polysilicon gate 412. Thereafter, polysilicon layer 416 is formed with portions of polysilicon layer 416 remaining undoped to form channel 418 in the thin film transistor. Polysilicon gate 406 forms the gate of an NMOS transistor within a pass gate while polysilicon gate 412 forms the gate of a PMOS transistor in the form of a thin film transistor in the pass gate. A planarizing layer 420 is formed and then a bit line contact 422 also is formed.

Thus, the present invention provides an improved memory in which memory cells are accessed by pass gates.

With the use of pass gates, the present invention allows for both a good "0" and a good "1" to be written into the memory cell. Thus, the present invention allows for the maintenance of memory cells' stability as power supply voltages are scaled. Although the depicted example is directed towards a particular type of SRAM memory cell, the present invention may be applied to other types of memories, such as, for example, a 6T SRAM cell or a DRAM cell.

Thus, the present invention overcomes the problem in a logic "1" state in a memory cell, the load (e.g. a pull-up transistor or resistor) has to pull up the last portion of the voltage required for a good logic "1" since the access transistor cannot pull the voltage up to the power supply voltage. This last portion is typically the threshold voltage of the access transistor. Since loads are usually high impedence loads, such an architecture is slower than that of the present invention. The present invention also provides a speed up of the overall operation of the memory cell because the writing operation always has a "1" to either the bit line or its complementary bit line.

While the invention has been particularly shown and described with reference to a preferred embodiment, it will be understood by those skilled in the art that various changes in form and detail may be made therein without departing from the spirit and scope of the invention.

What is claimed is:

1. A memory comprising:
   a memory cell;
   a first pass gate connecting the memory cell to a bit line; and
   a second pass gate connecting the memory cell to a complementary bit line, wherein the first and second pass gates each include a first, thin film transistor formed over a second transistor,
   wherein the first pass gate and the second pass gate are connected to and controlled by a word line and a complementary word line.

2. The memory of claim 1, wherein each transistor is a field effect transistor.

3. The memory of claim 1, wherein the thin film transistor is a p-channel thin film transistor.

4. The memory of claim 1, wherein the second transistor is a metal-oxide-semiconductor transistor.

5. The memory of claim 1, wherein the second transistor is an n-channel transistor and the first transistor is a p-channel transistor, each transistor having a first source/drain, a second source/drain and a gate, wherein the first source/drain of the n-channel transistor is connected to the first source/drain of the p-channel transistor, the second source/drain of the n-channel transistor is connected to the second source/drain of the p-channel transistor, the gate of the n-channel transistor is connected to the word line and the gate of the p-channel transistor is connected to the complementary word line.

6. The memory of claim 5, wherein the p-channel transistor is an inverted thin film transistor.

7. A static random access memory comprising:
   a storage latch;
   a first pass gate connecting the storage latch to a bit line; and
   a second pass gate connecting the storage latch to a complementary bit line,
   wherein the first pass gate and the second pass gate each include a first, thin film transistor formed over a second transistor, wherein the first pass gate and the second pass gate are connected to and controlled by a word line and a complementary word line.

8. The static random access memory of claim 7, wherein each transistor is a field effect transistor.

9. The static random access memory of claim 8, wherein the field effect transistors are metal-oxide-semiconductor transistors.

10. The static random access memory of claim 9, wherein the second transistor is an n-channel transistor and the first transistor is a p-channel transistor, each transistor having a first source/drain, a second source/drain, and a gate, wherein the first source/drain of the n-channel transistor is connected to the first source/drain of the p-channel transistor, the second source/drain of the n-channel transistor is connected to the second source/drain of the p-channel transistor, the gate of the n-channel transistor is connected to the word line and the gate of the p-channel transistor is connected to the complementary word line.

11. The static random access memory of claim 7, wherein the first transistor is a p-channel thin film transistor.

12. A memory device comprising:

a plurality of word lines;

a plurality of complementary word lines;

a plurality of bit lines;

a plurality of complementary bit lines; and a plurality of cells, wherein each cell comprises a storage latch, a first pass gate connecting the storage latch to a bit line within the plurality of bit lines, and a second pass gate connecting the storage latch to a complementary bit line within the plurality of complementary bit lines, wherein the first pass gate and second pass gate are connected and controlled by a word line within the plurality of word lines and a complementary word line with in the plurality of complementary word lines, wherein the first pass gate and the second pass gate each include a first, thin film transistor formed over a second transistor.

13. The memory device of claim 12, wherein the second transistor is a n-channel transistor and the first transistor is a thin film p-channel transistor.

14. The memory device of claim 12, wherein the second transistor is a metal-oxide-semiconductor transistor.

* * * * *